United States Patent
Lee et al.

(10) Patent No.: US 10,135,019 B2
(45) Date of Patent: Nov. 20, 2018

(54) LIGHTING APPARATUS USING ORGANIC LIGHT-EMITTING DIODE AND METHOD OF FABRICATING THE SAME

(71) Applicant: LG Display Co., Ltd., Seoul (KR)

(72) Inventors: Shinbok Lee, Seoul (KR); Taejoon Song, Paju-si (KR); Namkook Kim, Suwon-si (KR); Soonsung Yoo, Goyang-si (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/687,290

(22) Filed: Aug. 25, 2017

(65) Prior Publication Data

US 2018/0151832 A1 May 31, 2018

(30) Foreign Application Priority Data

Nov. 30, 2016 (KR) ........................ 10-2016-0162017

(51) Int. Cl.
*H01L 51/52* (2006.01)
*H01L 51/56* (2006.01)
*H01L 27/32* (2006.01)
*H01L 51/00* (2006.01)
*F21Y 115/15* (2016.01)

(52) U.S. Cl.
CPC ...... *H01L 51/5237* (2013.01); *H01L 27/3206* (2013.01); *H01L 51/0017* (2013.01); *H01L 51/5203* (2013.01); *H01L 51/5206* (2013.01); *H01L 51/5221* (2013.01); *H01L 51/56* (2013.01); *F21Y 2115/15* (2016.08); *H01L 51/5212* (2013.01); *H01L 51/5228* (2013.01); *H01L 51/5268* (2013.01); *H01L 2251/5338* (2013.01); *H01L 2251/5361* (2013.01)

(58) Field of Classification Search
CPC .......................................... H01L 51/50–51/56
See application file for complete search history.

(56) References Cited

U.S. PATENT DOCUMENTS

2004/0007707 A1* 1/2004 Wirth .................. H01L 33/22
257/79
2012/0161616 A1 6/2012 Yamagishi et al.

FOREIGN PATENT DOCUMENTS

WO 2015/049854 A1 4/2015

OTHER PUBLICATIONS

Extended European Search Report dated May 8, 2018 in a counterpart application EP 17 20 2263.4.

* cited by examiner

*Primary Examiner* — Daniel Shook
(74) *Attorney, Agent, or Firm* — Polsinelli PC

(57) ABSTRACT

A lighting apparatus using an organic light-emitting diode and a method of fabricating the same according to the present disclosure are characterized in that contact electrodes are formed by laser ablation and printing after an organic emissive material, a conductive film as a cathode, and passivation layers are deposited on the entire surface of a substrate. The lighting apparatus may be fabricated in a simplified manner without using an open mask (metal mask), which is a complicated tool, and may be useful especially in roll-to-roll manufacturing.

20 Claims, 16 Drawing Sheets

LIGHTING APPARATUS USING ORGANIC LIGHT-EMITTING DIODE AND METHOD OF FABRICATING THE SAME

CROSS-REFERENCE TO RELATED APPLICATION

Pursuant to 35 U.S.C. § 119(a), this application claims the benefit of earlier filing date and right of priority to Korean Application No. 10-2016-0162017, filed on Nov. 30, 2016, the contents of which is incorporated by reference herein in its entirety.

BACKGROUND

Field of the Disclosure

The present disclosure relates to a lighting apparatus, and more particularly, to a lighting apparatus using an organic light-emitting diode and a method of fabricating the same. Although the present disclosure is suitable for a wide scope of applications, it is particularly suitable for a lighting apparatus using an organic light-emitting diode, which allows for a simplified fabrication process by patterning the organic light-emitting diode without using an open mask, and a method of fabricating the same.

Description of the Background

Common lighting apparatuses currently being used include fluorescent lamps and incandescent lamps. The incandescent lamps have good color rendering index (CRI) but very low energy efficiency, and the fluorescent lamps have good efficiency but low color rendering index and contain mercury, posing environmental concerns.

A color rendering index, which indicates how accurately colors are reproduced, is a measure of the ability of a light source to reveal the color of an object faithfully in comparison with a reference light source. The CRI of sunlight is 100.

To resolve the problems with the conventional lighting apparatuses, light-emitting diodes (LEDs) are being proposed these days. However, the LEDs are made from inorganic emissive materials and have the highest luminous efficiency at blue wavelengths, and their luminous efficiency decreases towards red wavelengths and green wavelengths, which is where the eye is most sensitive. Thus, when a red LED, a green LED, and a blue LED combine to emit white light, the luminous efficiency is low.

Lighting apparatuses using an organic light-emitting diode (OLED) are being developed as another alternative. A typical lighting apparatus using an OLED has an anode made of ITO over a glass substrate. Then, an organic emissive layer and a cathode are formed, and a passivation layer and a laminate film are attached on top of them.

The deposition process of the organic emissive layer and the electrodes, which is the core process, is usually performed in high vacuum atmosphere, so it requires as many deposition chambers for maintaining high vacuum as there are thin films to be deposited.

In recent years, the use of flexible substrates instead of glass substrates is actively under research and development. In this case, a flexible substrate, usually wound on a roll, is installed on equipment—that is, roll-to-roll equipment for continuous feeding and deposition. However, this causes to increase in the total number of processes; especially, in the OLED process after the formation of the anode, the organic emissive layer, cathode, and passivation layer are deposited using different open masks (i.e., metal masks) for the different layers. After the deposition using open masks, a cleaning process is needed at every step, and the substrate and the open masks should be aligned with each other. A misalignment may in create shadow and pattern tolerance, leading to defects.

SUMMARY OF THE DISCLOSURE

The present disclosure is directed to solving the above-described problems, and an aspect of the present disclosure is to provide a lighting apparatus using an organic light-emitting diode, which allows for depositing an organic light-emitting diode without using an open mask, and a method of fabricating the same.

These and other aspects and features of the present disclosure will become better understood with reference to the appended claims.

An exemplary aspect of the present disclosure provides a lighting apparatus using an organic light-emitting diode, including: a substrate divided into a lighting area, peripheral areas, and first and second contact areas, a first electrode on the substrate and a first passivation layer on the first electrode.

The lighting apparatus using the organic light-emitting diode of the exemplary aspect of the present disclosure further includes an organic emissive layer, second electrode, and second passivation layer formed on the entire surface of the substrate where the first passivation layer is provided, a trench in the peripheral areas of the substrate and separating the organic emissive layer in the lighting area and the organic emissive layer in the peripheral areas and a metal film on the second passivation layer in the lighting area and peripheral areas of the substrate including an inside of the trench, with an adhesive in between.

The first electrode may be provided in the lighting area, peripheral areas, and first contact area of the substrate.

The first passivation layer may be provided in the lighting area and peripheral areas of the substrate where the first electrode is provided, and in the second contact area of the substrate.

The trench may expose the first passivation layer as the organic emissive layer, second electrode, and second passivation layer in the peripheral areas are removed.

The adhesive layer may be placed in the trench that is provided by removing the organic emissive layer, second electrode, and second passivation layer.

The lighting apparatus may further include first and second contact electrodes placed in the first and second contact areas of the substrate and electrically connected to the first and second electrodes, respectively.

The second contact area of the substrate may be positioned in the peripheral area of the substrate opposite the first contact area, and expose the second contact electrode to the outside as the metal film is removed.

The organic emissive layer, second electrode, and second passivation layer may be exposed through the sides of the substrate.

The trench may be provided in the shape of a rectangular frame along the outer perimeter of the lighting area, in the peripheral areas of the substrate.

Another exemplary aspect of the present disclosure provides a method of fabricating a lighting apparatus using an organic light-emitting diode, including, forming a first electrode on a substrate divided into a lighting area, peripheral areas, and first and second contact areas, forming a first passivation layer on the substrate where the first electrode is formed, forming an organic emissive layer, second electrode, and second passivation layer on the entire surface of the substrate where the first passivation layer is formed, forming a trench by removing the organic emissive layer, second electrode, and second passivation layer from the peripheral areas, the trench separating the organic emissive layer in the lighting area and the organic emissive layer in the peripheral areas and attaching a metal film on the second passivation layer in the lighting area and peripheral areas, with an adhesive layer in between.

The first electrode may be formed in the lighting area, peripheral areas, and first contact area of the substrate.

The first passivation layer may be formed in the lighting area and peripheral areas of the substrate where the first electrode is formed, and in the second contact area of the substrate.

The trench may expose the first passivation layer as the organic emissive layer, second electrode, and second passivation layer are removed from the peripheral areas of the substrate by laser ablation.

The adhesive layer may be placed in the trench that is formed by removing the organic emissive layer, second electrode, and second passivation layer.

The method may further include, when forming the trench, forming first and second contact holes exposing the first electrode and the first passivation layer by removing the organic emissive layer, second electrode, and second passivation layer from the first and second contact areas of the substrate.

The method may further include forming first and second contact electrodes in the first and second contact areas of the substrate, the first and second contact electrodes being electrically connected to the first and second electrodes via the first and second contact holes.

A further exemplary aspect of the present disclosure provides an organic light-emitting diode for a lighting apparatus including a substrate having a lighting area, a peripheral area, and first and second contact areas; an auxiliary electrode on the substrate; a first electrode on the auxiliary electrode; a first passivation layer on the substrate including the first electrode; an organic emissive layer, a second electrode, and a second passivation layer on the entire surface of the substrate including the first passivation layer; a trench disconnecting the organic emissive layer at the peripheral area.

As described above, the lighting apparatus using an organic light-emitting diode and the method of fabricating the same according to an exemplary aspect of the present disclosure may simplify the fabrication process of the lighting apparatus without using an open mask (metal mask), which is a complicated tool. Accordingly, it is possible to reduce costs and simplify the processes and equipment, making them adaptable to a variety of models without additional cost.

Moreover, the lighting apparatus using an organic light-emitting diode and the method of fabricating the same according to an exemplary aspect of the present disclosure allow for patterning organic light-emitting diodes by using simple equipment, without using an open mask and other tools, making them useful for roll-to-roll manufacturing.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings.

DETAILED DESCRIPTION OF THE DISCLOSURE

Figure 1:
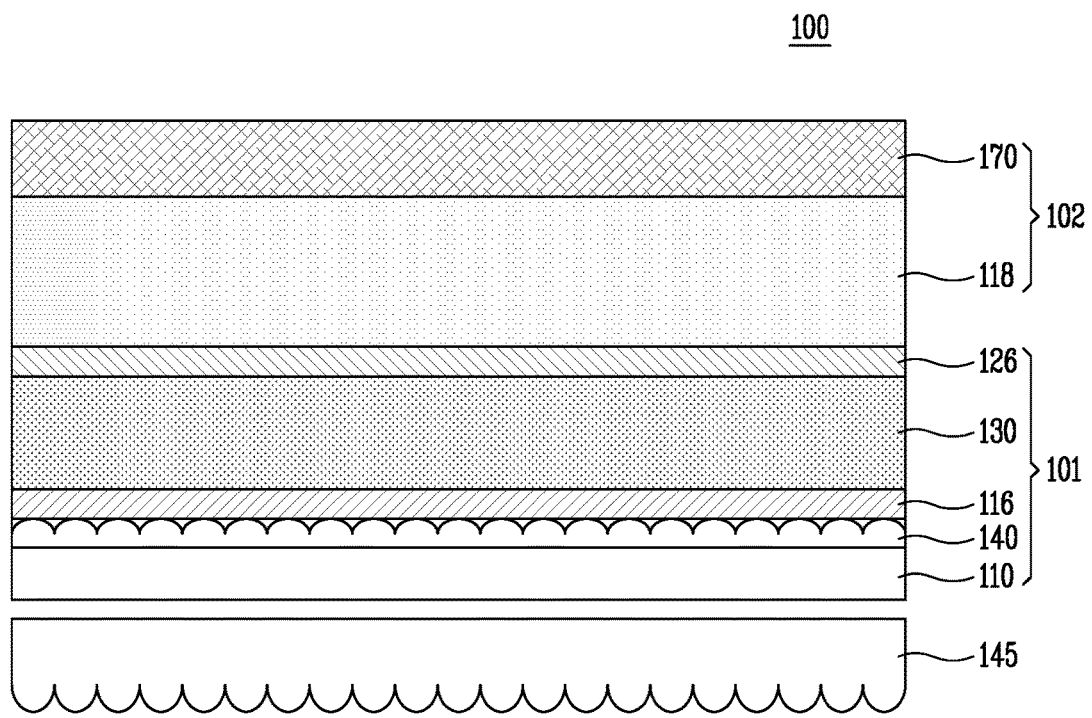
FIG. 1 is a cross-sectional view exemplifying a lighting apparatus using an organic light-emitting diode according to an exemplary aspect of the present disclosure.

Hereinafter, a lighting apparatus using an organic light-emitting diode and a method of fabricating the same according to a preferred aspect of the present disclosure will be described in sufficient detail to enable a person of ordinary skill in the art to readily practice the disclosure.

Advantages and features of the present disclosure and methods of accomplishing the same may be understood more readily by reference to the following detailed description of preferred aspects and the accompanying drawings. The present disclosure may, however, be embodied in many different forms and should not be construed as being limited to the aspects set forth herein. Rather, these aspects are provided so that this disclosure will be thorough and complete and will fully convey the concept of the disclosure to those skilled in the art, and the present disclosure will only be defined by the appended claims. Like numbers refer to like elements throughout the specification. In the drawings, the sizes and relative sizes of layers and regions may be exaggerated for clarity.

It will be understood that when an element or a layer is referred to as being "on" or "above" another element or layer, it can be directly on or above the other element or layer or intervening elements or layers may be present. In contrast, when an element or a layer is referred to as being "directly on" or "directly above" another element or layer, there are no intervening elements or layers present.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if an element illustrated in the drawings is turned over, the element described to be "below" or "beneath" another element may be put "above" the other element. Accordingly, the exemplary wording "below" may include both directions corresponding to "below" and "above".

The terms used in the present specification are used to describe example aspects of inventive concepts, and not to limit the inventive concepts. A singular form may include a plural form, unless otherwise defined. The terms "comprise" and/or "comprising" specify the existence of mentioned components, steps, operations and/or elements thereof, and do not exclude the existence or addition of one or more components, steps, operations and/or elements thereof.

FIG. 1 is a cross-sectional view exemplifying a lighting apparatus using an organic light-emitting diode according to an exemplary aspect of the present disclosure.

Figure 2:
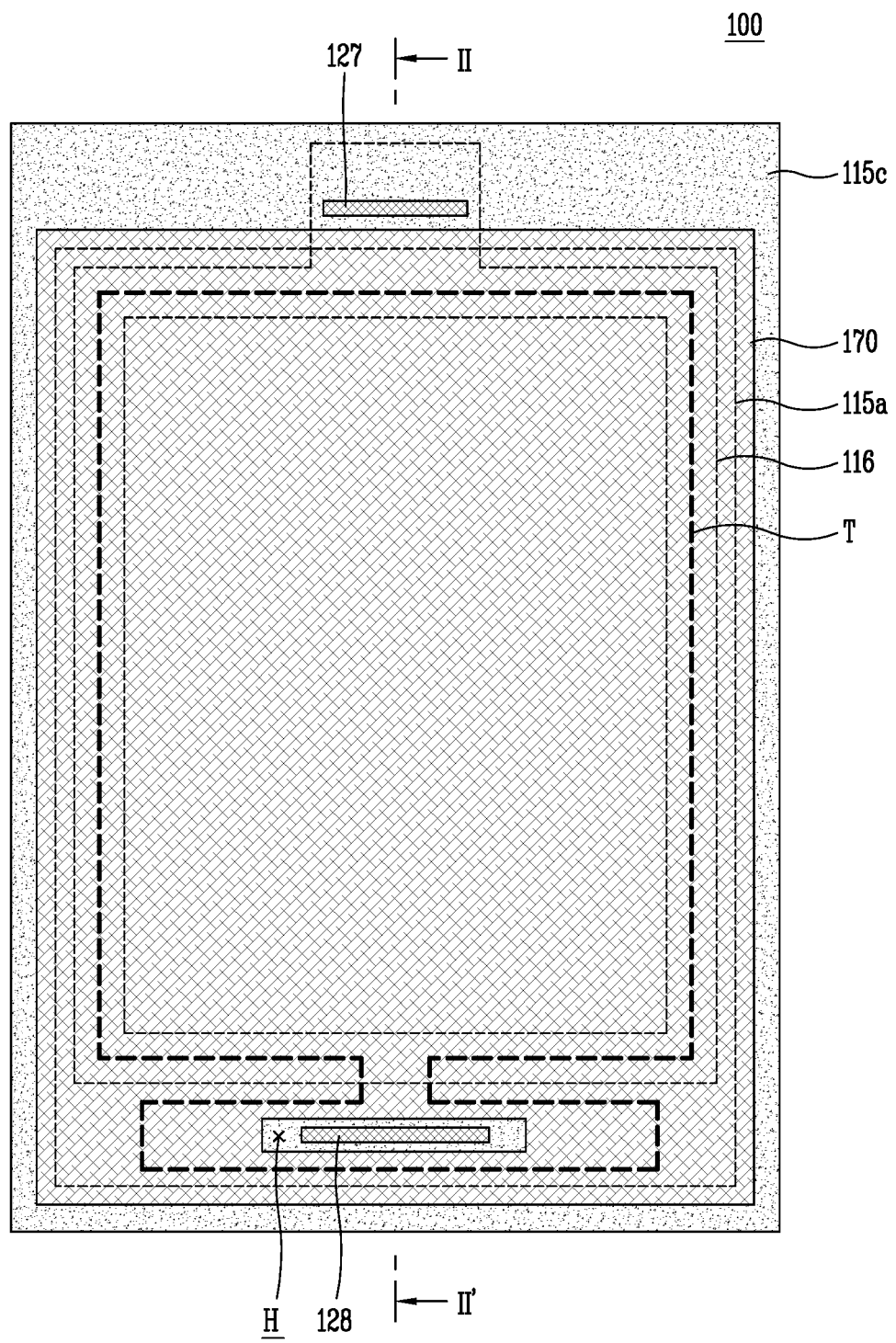
FIG. 2 is a plan view schematically showing a lighting apparatus using an organic light-emitting diode according to an exemplary aspect of the present disclosure.

FIG. 2 is a plan view schematically showing a lighting apparatus using an organic light-emitting diode according to an exemplary aspect of the present disclosure.

Figure 3:
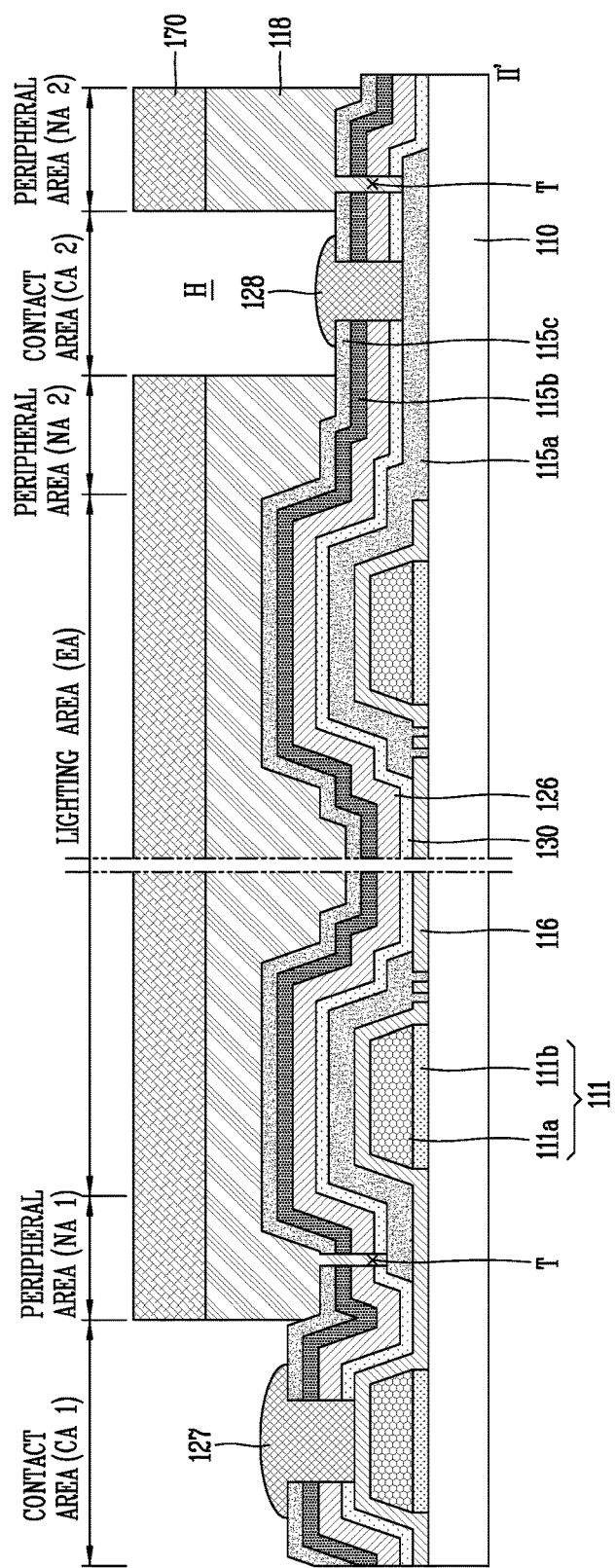
FIG. 3 is a cross-sectional view of the lighting apparatus using an organic light-emitting diode according to an exemplary aspect of the present disclosure, taken along line II-II' of FIG. 2.

FIG. 3 is a schematic cross-sectional view of the lighting apparatus using an organic light-emitting diode according to an exemplary aspect of the present disclosure, taken along line II-II' of FIG. 2.

The present disclosure provides a lighting apparatus using an organic light-emitting diode made of organic material, rather than a lighting apparatus using an inorganic light-emitting diode made of inorganic material.

An OLED made of organic emissive material has relatively good green and red emission efficiency compared to an inorganic light-emitting diode. Another advantage of the OLED is that it offers an improved color rendering index because of its relatively broad red, green, and blue emission peak widths compared to the inorganic light-emitting diode, thereby generating light more close to sunlight.

In the description below, the lighting apparatus of the disclosure is described as a lighting apparatus that flexibly bends, but the present disclosure may be applicable not only to a bendable lighting apparatus, but also to general lighting apparatuses that are not bendable.

Referring to FIGS. 1 to 3, a lighting apparatus 100 using an organic light-emitting diode according to an exemplary aspect of the present disclosure may include an organic light-emitting diode part 101 where surface emission occurs, and a sealing part 102 that seals the organic light-emitting diode part 101.

In this case, an external light extraction layer 145 for increasing haze may be added to the bottom of the organic light-emitting diode part 101.

The external light extraction layer 145 is made of scattering particles of TiO2, etc. dispersed in resin, and may be attached to the bottom of a substrate 110 through an adhesive layer (not shown).

The organic light-emitting diode part 101 is made up of organic light-emitting diodes placed on the substrate 101. In this case, an internal light extraction layer 140 may be added between the substrate 110 and the organic light-emitting diodes.

A planarization layer (not shown) may be added to the top of the internal light extraction layer 140.

In this case, the substrate 110 may be divided into a lighting area EA that actually emits light and sends it out, and peripheral areas NA1 and NA2 around the lighting area EA.

The substrate 110 may additionally include contact areas CA1 and CA2 that are electrically connected externally via contact electrodes 127 and 128 and apply signals to the lighting area EA.

The contact areas CA1 and CA2 may be electrically connected externally via the contact electrodes 127 and 128 as they are not covered by a metal film 170 used as a sealing means.

The first contact area CA1 may be located outside the first peripheral area NA1, and the second contact area CA2 may be located within the second peripheral area NA2 and exposed externally via an open hole H. Accordingly, the metal film 170 may be attached to the entire surface of the lighting area EA and peripheral areas NA1 and NA2 of the substrate 110, except the open hole H.

An organic light-emitting diode is formed by a first electrode 116 and a second electrode 126 positioned on the substrate 110 and an organic emissive layer 130 situated between the first and second electrodes 116 and 126. In the lighting apparatus 100 of such a structure, when a signal is applied to the first electrode 116 and second electrode 126 of the organic light-emitting diode, the organic emissive layer 130 produces and emits light over the entire lighting area EA.

The organic emissive layer 130 may be made up of light-emitting layers that produce white light. For example, the organic emissive layer 130 may be made up of blue, red, and green emitting layers or may be made up of a blue emitting layer and a yellow-green emitting layer stacked in tandem. However, the organic emissive layer 130 of this disclosure is not limited to the above-described structure, but various structures may be applied to it.

The organic emissive layer 130 of this disclosure may further include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

A trench T exposing a first passivation layer 115a may be formed by removing a portion of the organic emissive layer 130, second electrode 126, and second and third passivation layers 115b and 115c from the peripheral areas NA1 and NA2 of the substrate 110. The trench T surrounds the lighting area EA and functions to prevent moisture from penetrating the organic emissive layer 130 in the lighting area EA. Generally, polymers used as organic emissive materials, when combined with moisture, degrade quickly in their light-emitting characteristics, and the luminous efficiency of the organic emissive layer 130 therefore decreases. Especially when the organic emissive layer 130 in the lighting apparatus 100 is partially exposed to the outside, moisture spreads into the lighting apparatus 100 along the organic emissive layer 130, thereby lowering the luminous efficiency of the lighting apparatus 100. To overcome this, in the present disclosure, the trench T is formed all around the outer perimeter of the lighting area EA, so as to prevent moisture from penetrating the organic emissive layer 130 in the lighting area EA of the lighting apparatus 100 from which light is actually produced and emitted.

Referring to FIG. 2, the trench T of this disclosure may be formed in the shape of an overall rectangular frame, recessed between the lighting area EA and the second contact area CA2, but the present disclosure is not limited to this shape.

The trench T may separate the organic emissive layer 130 along the outer perimeter of the lighting area EA, thereby preventing moisture from spreading into the lighting area EA along the organic emissive layer 130. In particular, the trench T of this disclosure may simplify the process by laser ablation without using any photolithography process.

In this case, the first electrode 116 is positioned on the substrate 110 made of transparent material. The substrate 110, although may be made of a hard material such as glass, may be made of a flexible material such as plastic to make the lighting apparatus 100 bendable. Moreover, the present disclosure allows for a roll-to-roll processing by using a flexible plastic material as the substrate 110, thus facilitating a fabrication process of the lighting apparatus 100.

The first electrode 116 is formed in the lighting area EA, first peripheral area NA1, and first contact area CA1, and may be made of a transparent conductive material with a high work function. For example, in the present disclosure, the first electrode 116 may be made of a conductive material of tin oxide, such as ITO (indium tin oxide) or a conductive material of zinc oxide, such as IZO (indium zinc oxide), or may also be made of a transparent conductive polymer.

An auxiliary electrode 111 may be placed in the lighting area EA and first contact area CA1 of the substrate 110 and electrically connected to the first electrode 116. The first electrode 116 has the advantage of being made of transparent conductive material and transmitting emitted light therethrough, but also has the disadvantage that it has very high electrical resistance compared to opaque metals. Accordingly, in the fabrication of a large-area lighting apparatus 100, an electrical current applied to a wide lighting area may not be uniformly distributed due to the high resistance of the transparent conductive material, and this non-uniform current distribution makes it impossible for the large-area lighting apparatus 100 to emit light with uniform brightness.

The auxiliary electrode 111 is positioned across the entire lighting area EA, in the shape of a matrix form of thin lines, a mesh, a hexagon, an octagon, or a circle so that an electric current is evenly applied to the first electrode 116 over the entire lighting area EA, thus enabling the large-area lighting apparatus 100 to emit light with uniform brightness.

Although FIG. 3 illustrates an example where the auxiliary electrode 111 is positioned below the first electrode 116, the present disclosure is not limited to this example, and the auxiliary electrode 111 may be positioned over the first electrode 116. The auxiliary electrode 111 placed in the first contact area CA1 may be used as a current transfer path to the first electrode 116, and also may function as a contact electrode that comes into contact with the outside and applies an external current to the first electrode 116.

The auxiliary electrode 111 may be made of a metal with high conductivity, such as Al, Au, Cu, Ti, W, Mo, or an alloy thereof. The auxiliary electrode 111 may have a two-layer structure of an upper auxiliary electrode 111a and a lower auxiliary electrode 111b, but the present disclosure is not limited to this structure, and the auxiliary electrode 111 may consist of a single layer.

The first passivation layer 115a may be stacked in the lighting area EA, peripheral areas NA1 and NA2, and second contact area CA2 of the substrate 110.

The first passivation layer 115a in the lighting area EA is configured to cover the auxiliary electrode 111 and the overlying first electrode 116, but the first passivation layer 115a is not formed in the light emission area where light is actually emitted. In particular, the first passivation layer 115a in the lighting area EA reduces a difference in level (or step coverage) caused by the auxiliary electrode 111 as it surrounds the auxiliary electrode 111, which allows for stable formation of various layers that are to be formed later, without separation.

The first passivation layer 115a may be made of an inorganic material such as $SiO_x$ or $SiN_x$. Alternatively, the first passivation layer 115a may be made of an organic material such as photoacryl or be made of a plurality of layers of inorganic and organic materials.

The lighting apparatus 100 using an organic light-emitting diode according to an exemplary aspect of the present disclosure is characterized in that the organic emissive layer 130, the second electrode 126, and the second and third passivation layers 115b and 115c are positioned on the entire surface of the substrate 110 where the first electrode 116 and the first passivation layer 115a are placed.

That is, the lighting apparatus 100 using an organic light-emitting diode according to an exemplary aspect of the present disclosure is characterized in that the organic emissive layer 130, the second electrode 126, and the second and third passivation layers 115b and 115c are deposited on the entire surface, without using an open mask, which is a separate, complicated tool, and then patterned by laser ablation, followed by encapsulation and the formation of the contact electrodes 127 and 128.

In this case, the trench T is formed by removing the organic emissive layer 130, the second electrode 126, and the second and third passivation layers 115a and 115b from the peripheral areas NA1 and NA2 of the substrate 110 by laser ablation. Hereupon, the surface of the first passivation layer 115a may be exposed via the trench T.

Moreover, a first contact hole exposing the first electrode 116 may be formed by removing the organic emissive layer 130, the second electrode 126, and the second and third passivation layers 115a and 115b from the first contact area CA1 of the substrate 110 by laser ablation. In addition, a second contact hole exposing the first passivation layer 115a may be formed by removing the organic emissive layer 130, the second electrode 126, and the second and third passivation layers 115a and 115b from the second contact area CA2 of the substrate 110 by laser ablation.

The first contact electrode 127, electrically connected to the first electrode 116, and the second contact electrode 128, electrically connected to the second electrode 126, may be formed in the first and second contact holes by an Ag printing process. In this case, the first and second contact electrodes 127 and 128 may be electrically connected externally, and they, along with the trench T, may prevent moisture penetration through the sides, as well as applying a signal to the lighting area EA.

When using an open mask as in the conventional art, different open masks should be used on the organic emissive layer 130, second electrode 126, and the second and third passivation layers 115b and 115c, respectively. This requires elaborate manufacturing of masks and tools. Moreover, in a roll-to-roll processing, continuous feeding should be done on the roll-to-sheet in one-pass rather than in individual sheets. Thus, complicated line equipment is required, and it is difficult to achieve precision.

Accordingly, the present disclosure, without using open masks, may reduce costs and simplify the processes and equipment, making them adaptable to a variety of models without additional cost. Moreover, OLEDs may be patterned using simple equipment, without using an open mask and other tools, which is useful for roll-to-roll manufacturing.

That is, the present disclosure allows for micro pattern forming, without using complicated masks and tools, in roll-to-roll processing as well as in glass processing. Conventionally, open masks of different shapes have been manufactured and used for different types of products. On the other hand, when a laser is used, all that has to be done is to change design information and enter it in the equipment, without any alteration of open masks. This allows for easy adaptation to various types of products.

As described above, the organic emissive layer 130 is a white organic emissive layer, and may be made up of blue, red, and green emitting layers or be made up of a blue emitting layer and a yellow-green emitting layer stacked in tandem. Moreover, the organic emissive layer 130 may include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

The second electrode 126 may be made of metal, such as Al, Mo, Cu, and Ag, or an alloy such as MoTi.

The first electrode 116, the organic emissive layer 130, and the second electrode 126 in the lighting area EA constitute an organic light-emitting diode. The first electrode 116 is the anode of the organic light-emitting diode, and the second electrode 126 is the cathode. When an electric current is applied to the first electrode 116 and the second electrode 126, electrons are injected into the organic emissive layer 130 from the second electrode 126, and holes are injected into the organic emissive layer 130 from the first electrode 116. Thereafter, an exciton is created in the organic emissive layer 130, and the decay of the exciton results in generating light that is equivalent to the difference in energy between the lowest unoccupied molecular orbital and highest occupied molecular orbital (HOMO and LUMO) of the emissive layer, causing the light to radiate downward (towards the substrate 110 in the figure).

Since the first passivation layer 115a is positioned over the auxiliary electrode 111 in the lighting area EA, the organic emissive layer 130 above the auxiliary electrode 111 does not come into direct contact with the first electrode 116 and therefore the organic light-emitting diode is not present on the auxiliary electrode 111. That is, the organic light-emitting diode in the lighting area EA is formed only in the light-emission area within the auxiliary electrode 111 that has the shape of a matrix, for example.

As the above-described trench T is formed in the peripheral areas NA1 and NA2 of the substrate 110, the organic emissive layer 130 in the lighting area EA and the organic emissive layer 130 in the peripheral areas NA1 and NA2 may be separated from each other. In the present disclosure, since the organic emissive layer 130 in the lighting area EA and the organic emissive layer 130 in the peripheral areas NA1 and NA2 are separated by the trench T, moisture penetrating the outer region of the organic emissive layer 130 may be prevented from spreading along the organic emissive layer 130 into the lighting area EA from which light is actually emitted. Moreover, in the present disclosure, the organic emissive layer 130 becomes separated by laser ablation without addition of any open mask or photolithography process, thereby avoiding an additional fabrication process and the resulting increase in cost.

Likewise, the second electrode 126 in the lighting area EA and the second electrode 126 in the peripheral areas NA1 and NA2 are separated from each other because the second electrode 126 is positioned over the organic emissive layer 130 in the lighting area EA and peripheral areas NA1 and NA2, The second passivation layer 115b and the third passivation layer 115c may be formed on the entire surface of the substrate 110 where the second electrode 126 is formed.

The second passivation layer 115b may be made of an organic material such as photoacryl. The third passivation layer 115c may be made of an inorganic material such as SiOx and SiN$_x$, but the present disclosure is not limited to them.

A given sealant may be placed over the third passivation layer 115c. Such a sealant may be an epoxy compound, an acrylate compound, or an acrylic compound.

As described above, a first contact hole and a second contact hole respectively exposing the first electrode 116 and the first passivation layer 115a are formed by removing the organic emissive layer 130, second electrode 126, and second and third passivation layers 115a and 115b from the first and second contact areas CA1 and CA2 of the substrate 110, and the first contact electrode 127 and the second contact electrode 128 may be formed in the first contact hole and the second contact hole, respectively. In this case, the first contact electrode 127 and the second contact electrode 128 are electrically connected to an external power source to apply an electrical current to the first electrode 116 and the second electrode 126, respectively. The first contact electrode 127 and the second contact electrode 128 may be made using Ag.

An adhesive 118 such as PSA (pressure sensitive adhesive) is applied over the third passivation layer 115c, and the metal film 170 is positioned over the adhesive 118 so that the metal film 170 is attached to the third passivation layer 115c to seal the lighting apparatus 100.

The adhesive 118 may be a light curing adhesive or a heat curing adhesive.

As described above, in the present disclosure, the organic emissive layer 130 is stacked on the entire surface of the substrate 110, and the trench T is formed by laser ablation to separate the organic emissive layer 130, thereby preventing moisture from penetrating and spreading into the organic emissive layer 130 in the lighting area EA.

Moreover, the present disclosure allows for roll-to-roll manufacturing since the substrate 110 is made of a flexible plastic film and the organic emissive layer 130, second electrode 126, and second and third passivation layers 155b and 115c are deposited on the entire surface. This enables rapid fabrication of the lighting apparatus 100 and reduction of manufacturing costs.

Figure 4:
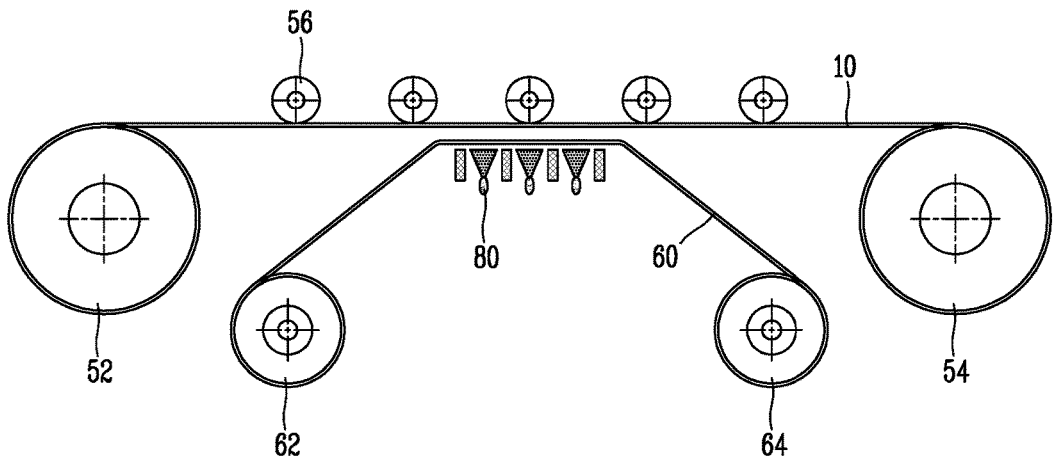
FIG. 4 is a cross-sectional view exemplifying the concept of roll-to-roll equipment.

FIG. 4 is a cross-sectional view exemplifying the concept of roll-to-roll equipment for manufacturing a flexible lighting apparatus that can bend.

Referring to FIG. 4, the roll-to-roll equipment for manufacturing a flexible lighting apparatus includes a film feed roller 52 feeding a plastic film 10, a film recovery roller 54 recovering the plastic film 10, and a guide roller 56 guiding the plastic film 10.

Moreover, the roll-to-roll equipment includes a mask feed roller 62 feeding an open mask 60 (or metal mask), a mask recovery roller 64 recovering the open mask 60, and an evaporator 80 depositing an organic material or metal.

In the roll-to-roll equipment thus constructed, the plastic film 10 used as a substrate for the lighting apparatus is fed from the film feed roller 62 to the evaporator 80, and at the same time, the open mask 60 is fed from the mask feed roller 62 to the evaporator 80. With the open mask 60 positioned on the entire surface of the plastic film 10, the evaporator 80 deposits an organic material or metal in some part of the plastic film 10.

After the deposition, the open mask 60 is separated from the plastic film 10, and the plastic film 10 is recovered by the film recovery roller 64 and the open mask 60 is recovered by the mask recovery roller 64.

Using the roll-to-roll equipment with this structure, the plastic film 10 is continuously fed by the film feed roller 62, thereby facilitating a fabrication process of the lighting apparatus in a continuous process. However, this roll-to-roll equipment has the following problems.

The roll-to-roll equipment may be used in forming a variety of metal patterns—especially useful when forming an organic emissive layer, second electrode, etc. This is achieved easily by roll-to-roll manufacturing because the organic emissive layer or the second electrode is deposited across the entire area of the substrate, rather than being patterned by a photolithography process in a certain part of the substrate.

However, when an organic emissive layer is formed by depositing an organic emissive material on the entire surface of the substrate by the roll-to-roll equipment, the side of the organic emissive layer deposited over the entire surface is formed at the same level as the side of the substrate, thus causing the organic emissive layer to be exposed to the outside through the side of the lighting apparatus. The organic emissive material is susceptible to moisture and, when combined with moisture, degrades quickly, causing the moisture to spread easily. Accordingly, the organic emissive layer should be kept from being exposed to external atmosphere in the fabrication of the lighting apparatus, in order to prevent the lighting apparatus from becoming defective due to the spread of moisture through the externally exposed organic emissive layer.

Hence, as the open mask blocks the perimeter area of the substrate, the organic emissive layer is not deposited in the perimeter area of the substrate when depositing the organic emissive material. Moreover, by sealing the perimeter area with a sealant or adhesive, the side of the organic emissive layer is sealed, and this prevents the organic emissive layer from being exposed to the external atmosphere.

However, when forming an organic emissive layer using the open mask 60, as shown in FIG. 4, a system (a feed roll, guide roll, recovery roll, etc.) that feeds the plastic film 10 and a system that feeds the open mask 60 should be integrated inline. This increases not only the length of the process line but also the length of the open mask 60. Moreover, the plastic film 10 and the open mask 60 should be fed in sync, and also need to be aligned in a continuous process. In addition, the open mask 60 should be cleaned after use, which is difficult due to the long length of the open mask 60.

In other words, although a roll-to-roll manufacturing process requires the use of an open mask to enable rapid fabrication of a lighting apparatus, the open mask makes it practically difficult to fabricate the lighting apparatus by using the roll-to-roll equipment.

On the other hand, in the present disclosure, a trench is formed by removing the organic emissive layer from the peripheral areas of the substrate by laser ablation. As such, the organic emissive layer becomes separated by the trench, even when an organic emissive layer is deposited across the entire area of the substrate and the side of the organic emissive layer is therefore exposed to the external atmosphere, thereby preventing moisture from penetrating into the lighting area through the exposed organic emissive layer. Accordingly, a lighting apparatus according to the present disclosure is fabricated without using an open mask, and this simplifies the fabrication process of the lighting apparatus, making it useful especially in roll-to-roll manufacturing.

In what follows, a lighting apparatus according to an exemplary aspect of the present disclosure and a method of fabricating a lighting apparatus with a typical structure by roll-to-roll processing will be described to explain the benefits of the fabrication process of a lighting apparatus according to an exemplary aspect of the present disclosure.

Figure 5:
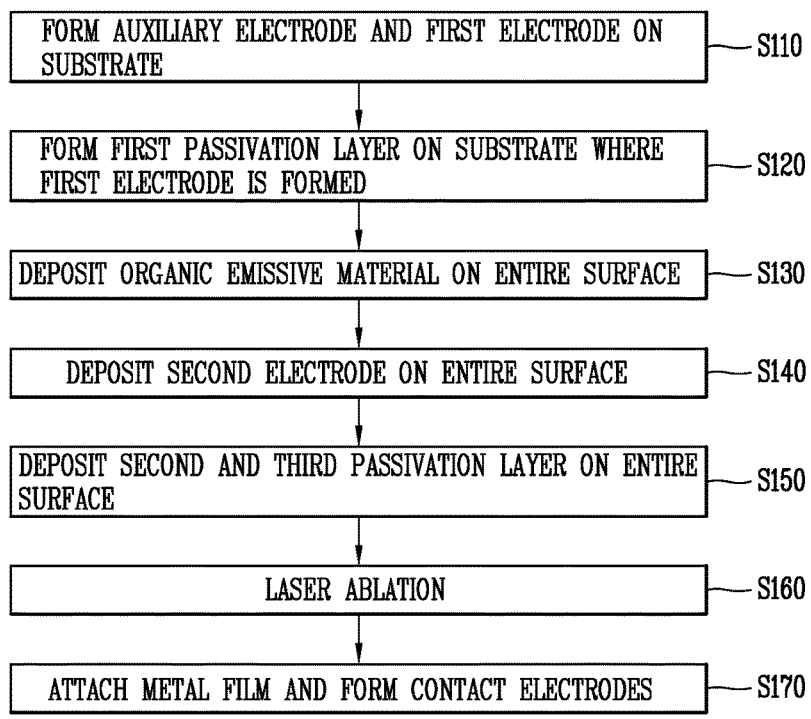
FIG. 5 is a flowchart sequentially showing a method of fabricating a lighting apparatus using an organic light-emitting diode according to an exemplary aspect of the present disclosure.

FIG. 5 is a flowchart sequentially showing a method of fabricating a lighting apparatus using an organic light-emitting diode according to an exemplary aspect of the present disclosure.

Referring to FIG. 5, firstly, an auxiliary electrode and a first electrode are formed on a substrate made of a flexible, transparent plastic film (S110), and then a first passivation layer is formed by stacking and etching an inorganic material (S120). The auxiliary electrode, first electrode, and first passivation layer may be formed inside roll-to-roll equipment by a photolithographic process using a photoresist and a photomask.

Subsequently, an organic emissive layer is formed by depositing an organic emissive material on the entire surface of the substrate by using the roll-to-roll equipment shown in FIG. 4 (S130). Since, in the present disclosure, an organic emissive material is deposited without using an open mask, the roll-to-roll equipment shown in FIG. 4 does not require the use of an open mask, mask feed roller, and mask recovery roller.

Afterwards, a second electrode is formed by depositing a metal on the entire surface of the substrate (S140), and then second and third passivation layers are deposited on the entire surface of the substrate (S150).

Subsequently, a trench is formed in peripheral areas of the substrate by removing the organic emissive layer, second electrode, and second and third passivation layers by laser ablation, and at the same time first and second contact holes are formed in contact areas (S160).

Afterwards, a metal film is attached with an adhesive, and then contact electrodes are formed in the contact areas and electrically connected to the first and second electrodes (S170).

Figure 6:
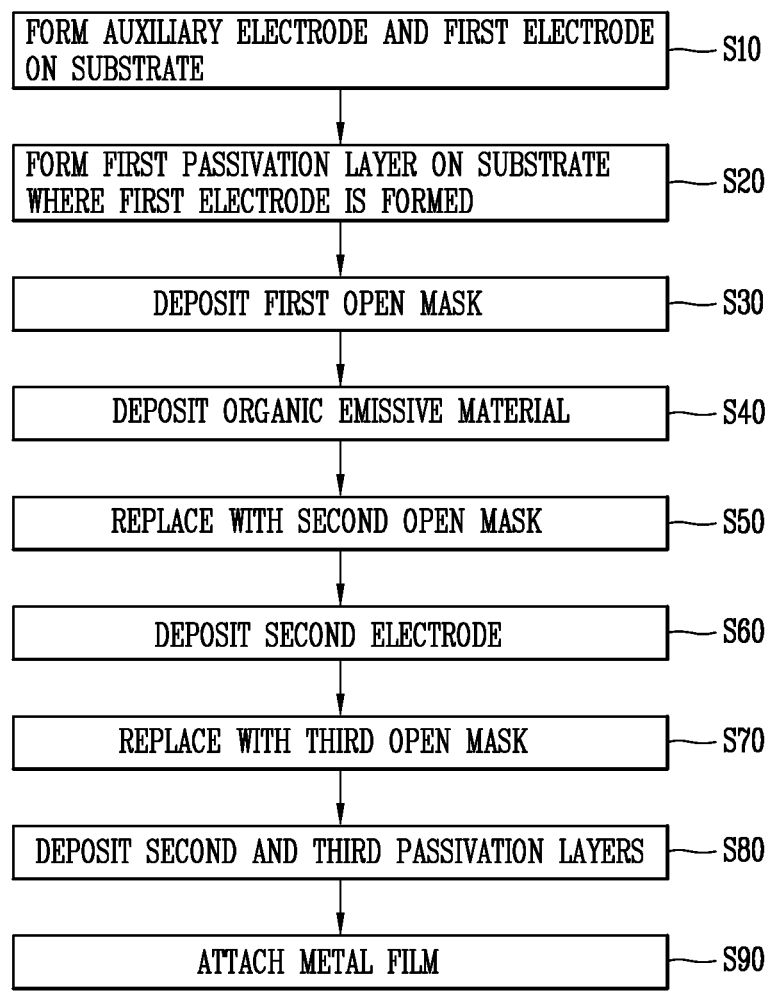
FIG. 6 is a flowchart sequentially showing a method of fabricating a lighting apparatus using an organic light-emitting diode according to a comparative example.

FIG. 6 is a flowchart sequentially showing a method of fabricating a lighting apparatus using an organic light-emitting diode according to a comparative example.

Referring to FIG. 6, firstly, an auxiliary electrode and a first electrode are formed on a substrate made of a flexible, transparent plastic film (S10), and then a first passivation layer is formed by stacking and etching an inorganic material (S20).

Subsequently, a first open mask (metal mask) is placed on the entire surface of the substrate, and then an organic emissive layer is formed by depositing an organic emissive material (S30 and S40).

Afterwards, the first open mask placed on the entire surface of the substrate is replaced with a new, second open mask, and then a metal is deposited to form a second electrode (S50 and S60).

Subsequently, the second open mask placed on the entire surface of the substrate is replaced with a new, third open mask, and then second and third passivation layers are formed (S70 and S80).

Afterwards, a metal film is attached with an adhesive, thereby completing a lighting apparatus (S90).

As described above, the present disclosure requires no open mask when fabricating a lighting apparatus by using roll-to-roll equipment. Thus, the step of placing an open mask and the step of replacing the open mask are not needed, unlike with the lighting apparatus according to the comparative example. Therefore, the lighting apparatus according to an exemplary aspect of the present disclosure allows for rapid fabrication.

Moreover, in the case of the lighting apparatus according to the comparative example, the open masks used in the previous process should be cleaned after completion of the process on the plastic film on the feed roller, before a plastic film is fed to the feed roller to resume the process. By contrast, the fabrication of a lighting apparatus according to an exemplary aspect of the present disclosure does not require cleaning of open masks. Accordingly, no cleaning equipment is required when fabricating a lighting apparatus according to an exemplary aspect of the present disclosure. This may reduce costs and prevent environmental contamination caused by cleaning. Moreover, no cleaning process is required between two consecutive deposition processes, thereby making the fabrication even more rapid.

Additionally, the lighting apparatus according to the comparative example requires equipment for positioning an open mask in front of the substrate, whereas the exemplary aspect of the present disclosure does not require such equipment, thereby simplifying the manufacturing equipment and reducing costs.

FIGS. 7A to 7E are plan views sequentially showing a method of fabricating the lighting apparatus using an organic light-emitting diode, shown in FIG. 2, according to an exemplary aspect of the present disclosure.

Figure 7A:
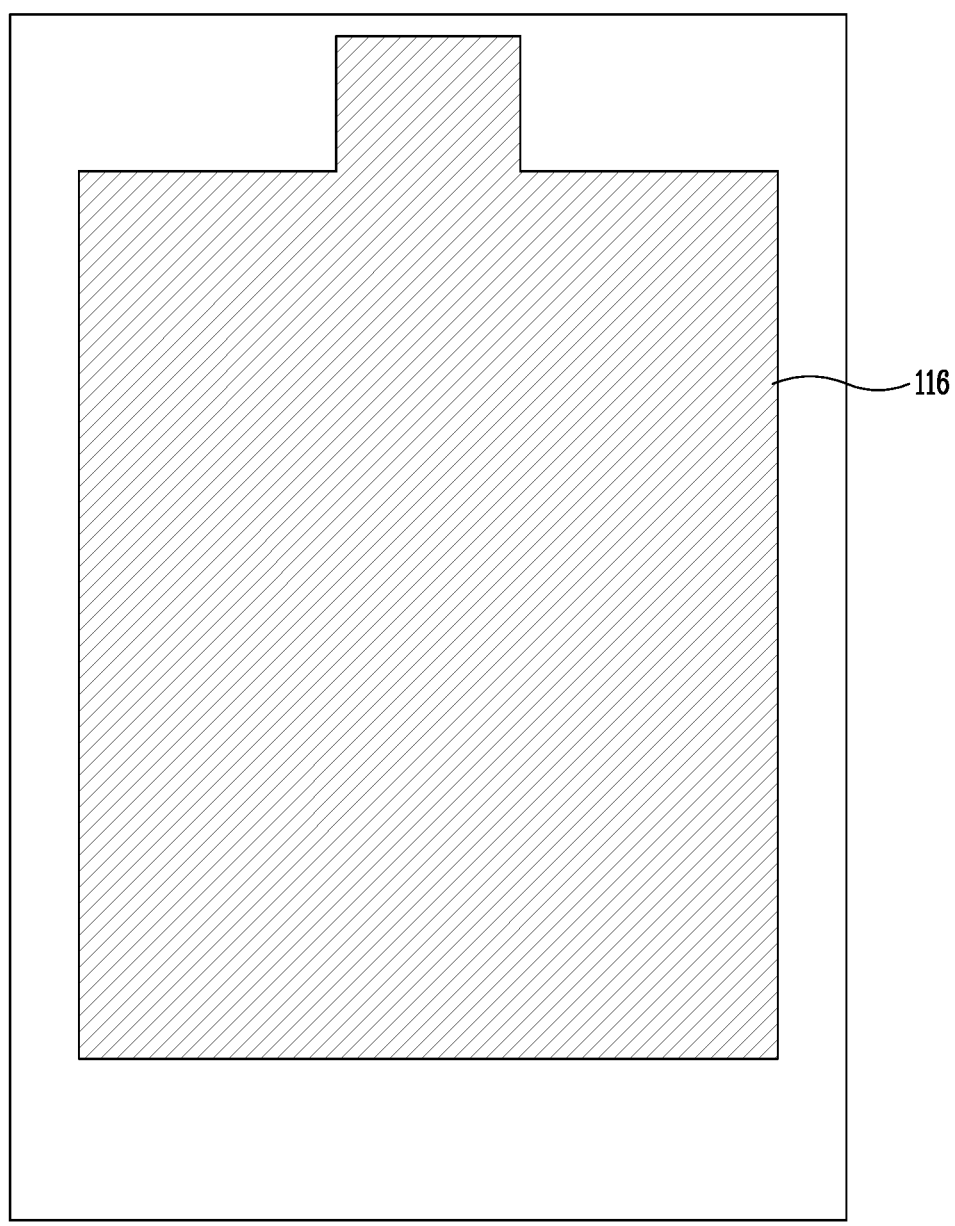
FIGS. 7A to 7E are plan views sequentially showing a method of fabricating the lighting apparatus using an organic light-emitting diode, shown in FIG. 2, according to an exemplary aspect of the present disclosure.
Figure 7B:
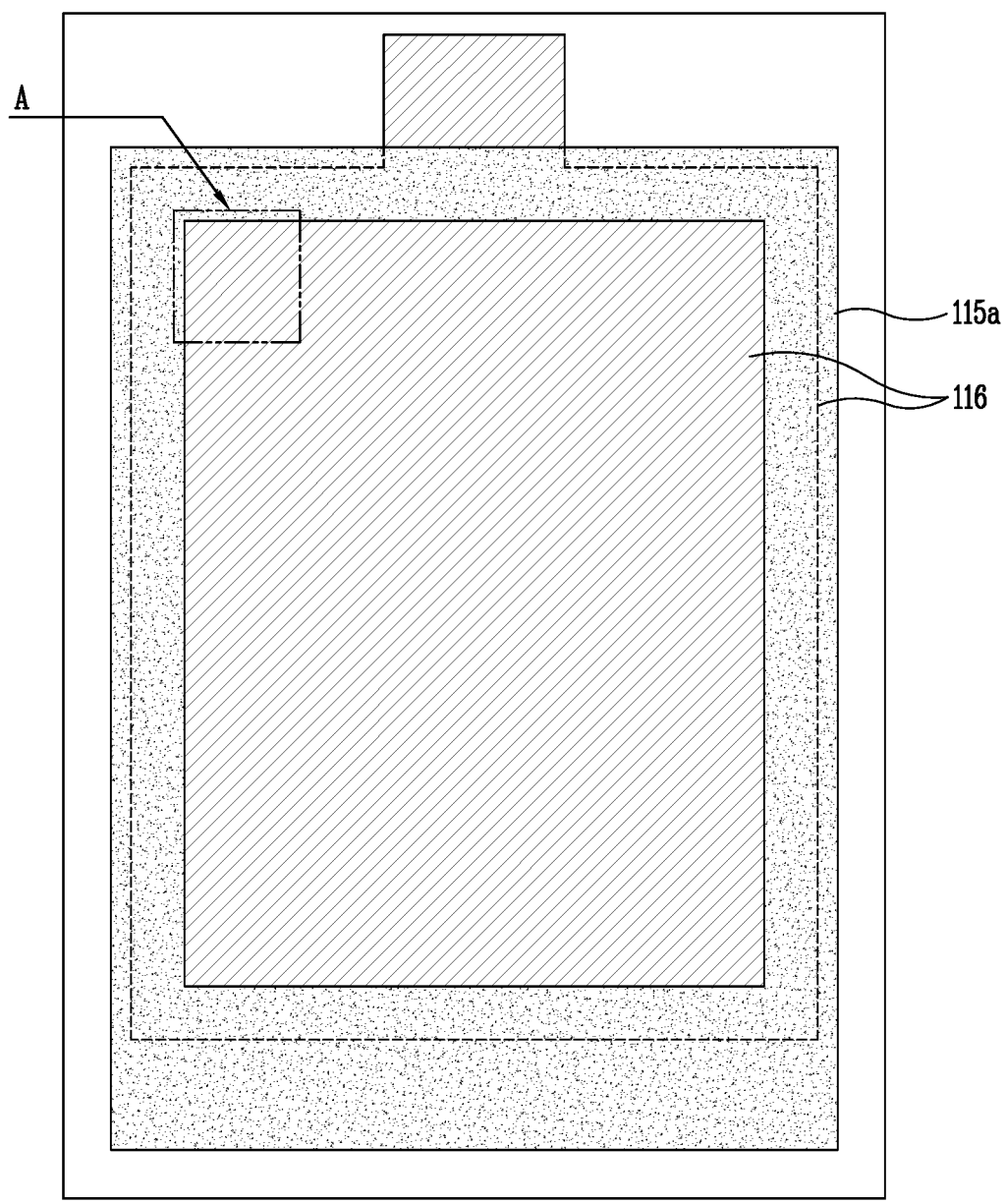
Figure 8:
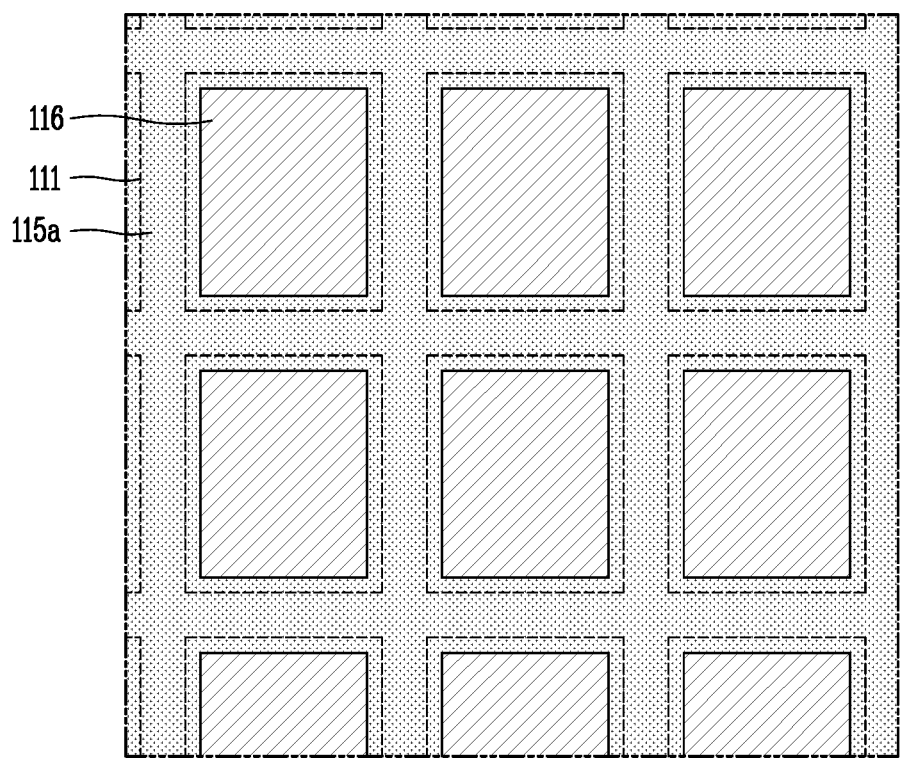
FIG. 8 is an enlarged view of the portion A of FIG. 7B.

FIG. 8 is an enlarged view of the portion A of FIG. 7B.

FIGS. 9A to 9E are cross-sectional views sequentially showing a method of fabricating the lighting apparatus using an organic light-emitting diode, shown in FIG. 3, according to an exemplary aspect of the present disclosure.

While the fabrication method here is illustrated with reference to a process carried out on roll-to-roll equipment, the present disclosure is not limited to the roll-to-roll equipment but may be applicable equally to general manufacturing equipment using a glass substrate.

Figure 9A:
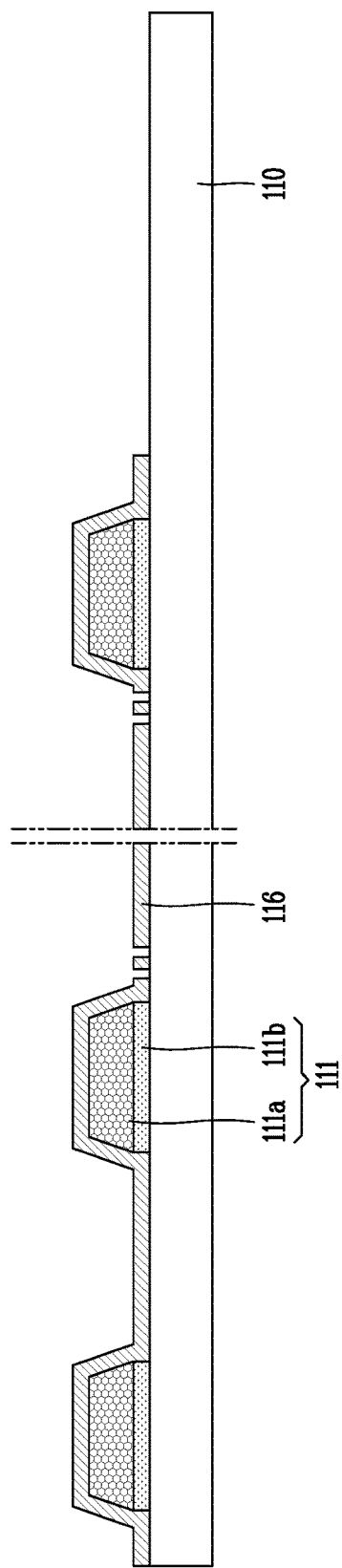
FIGS. 9A to 9E are cross-sectional views sequentially showing a method of fabricating the lighting apparatus using an organic light-emitting diode, shown in FIG. 3, according to an exemplary aspect of the present disclosure.

First of all, referring to FIGS. 7A and 9A, a metal such as Al, Au, Cu, Ti, W, Mo, or an alloy thereof is deposited on a substrate 110 which is divided into a lighting area, peripheral areas, and contact areas, and then etched to form an auxiliary electrode 111 consisting of a single layer or a plurality of layers in the lighting area and the first contact area.

Although FIGS. 7A and 9A illustrate an example where the auxiliary electrode 111 is formed of a two-layer structure of an upper auxiliary electrode 111a and a lower auxiliary electrode 111b, the present disclosure is not limited to this example, as stated above.

The auxiliary electrode 111 may be positioned across the entire lighting area EA, in the shape of a matrix of thin lines (see FIG. 8), a mesh, a hexagon, an octagon, or a circle.

Afterwards, a transparent conductive material such as ITO or IZO is stacked on the entire substrate 110 and etched to form a first electrode 116 in the first peripheral area and the first contact area.

While FIGS. 7A and 9A illustrate an example where the auxiliary electrode 111 is formed below the first electrode 116, the present disclosure is not limited to this example, and the auxiliary electrode 111 may be formed over the first electrode 116. The auxiliary electrode 111 placed in the first contact area may be used as a current transfer path to the first electrode 116, and also may function as a contact electrode that comes into contact with the outside and applies an external current to the first electrode 116.

Figure 9B:
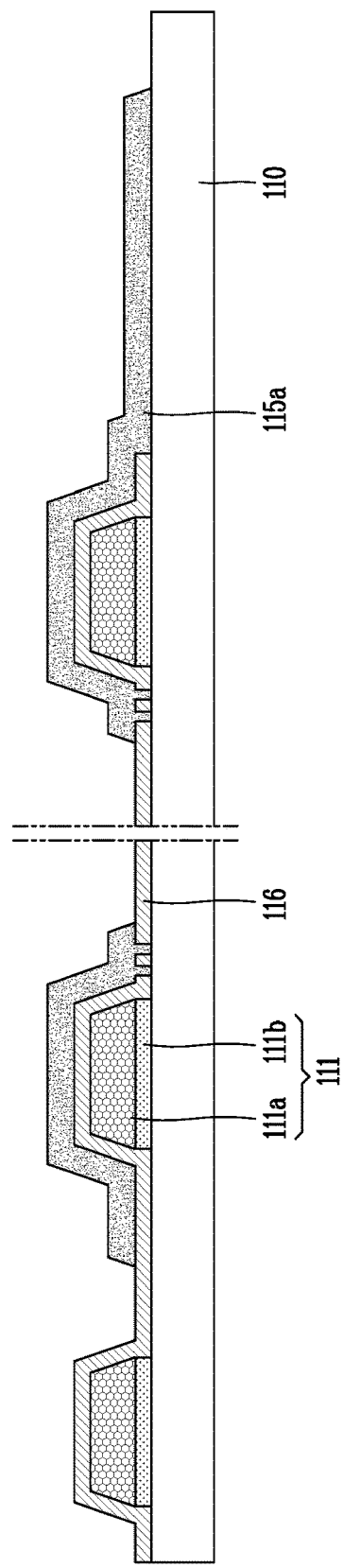

Subsequently, referring to FIGS. 7B and 9B, an inorganic material such as SiNx or SiO$_x$, or an organic material such as photoacryl is stacked in the lighting area, peripheral areas, and second contact area of the substrate 110. Afterwards, the inorganic material or organic material is etched to form a first passivation layer 115a on the top and side of the auxiliary electrode 111 in the lighting area and in a certain part of the peripheral areas.

The first passivation layer 115a in the lighting area is configured to cover the auxiliary electrode 111 and the overlying first electrode 116, but the first passivation layer 115a is not formed in the light emission area where light is actually emitted (although in practice, referring to FIG. 8, the first passivation layer 115a may be formed in a matrix shape in the light-emission area). In particular, the first passivation layer 115a in the lighting area reduces the difference in level caused by the auxiliary electrode 111 as it surrounds the auxiliary electrode 111, which allows for stable formation of various layers that are to be formed later, without separation.

Figure 7C:
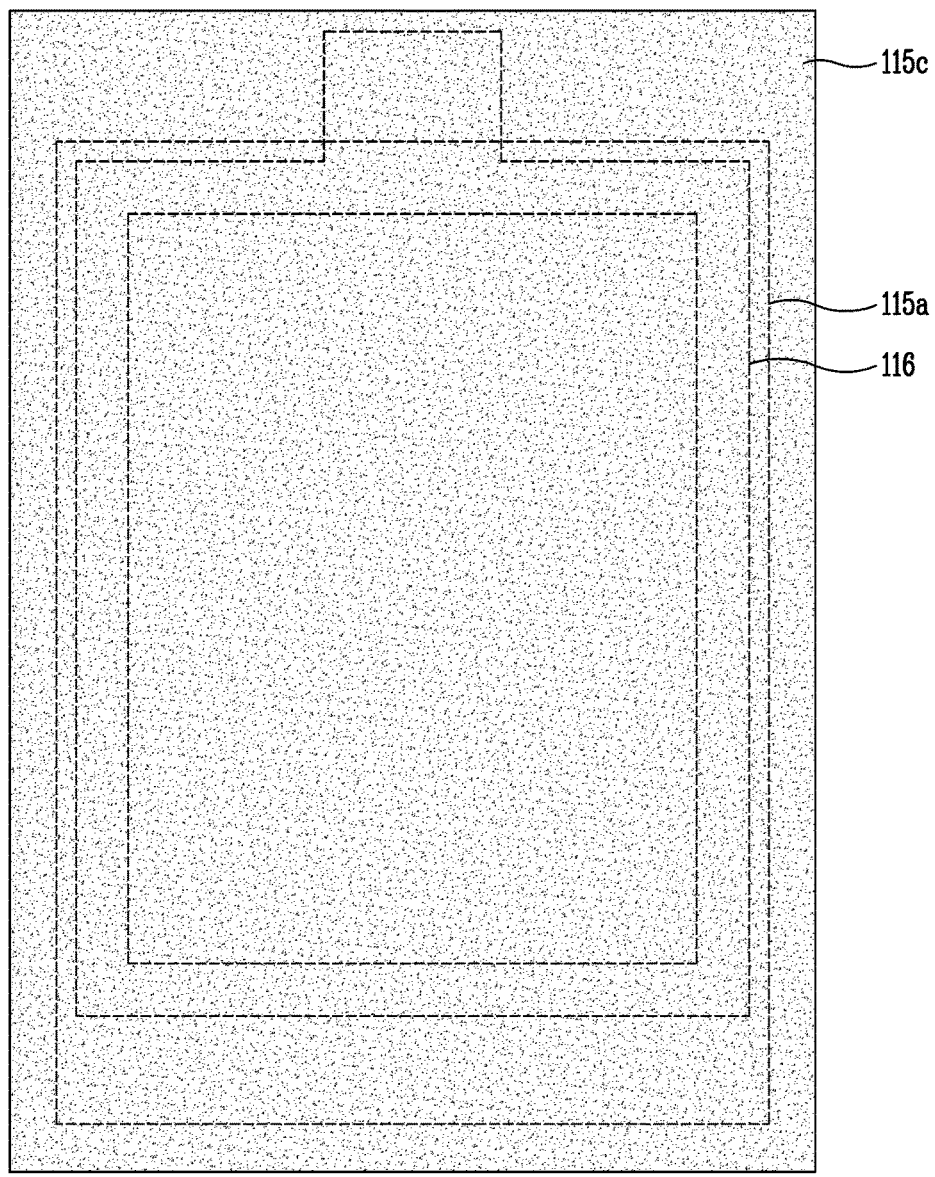
Figure 9C:
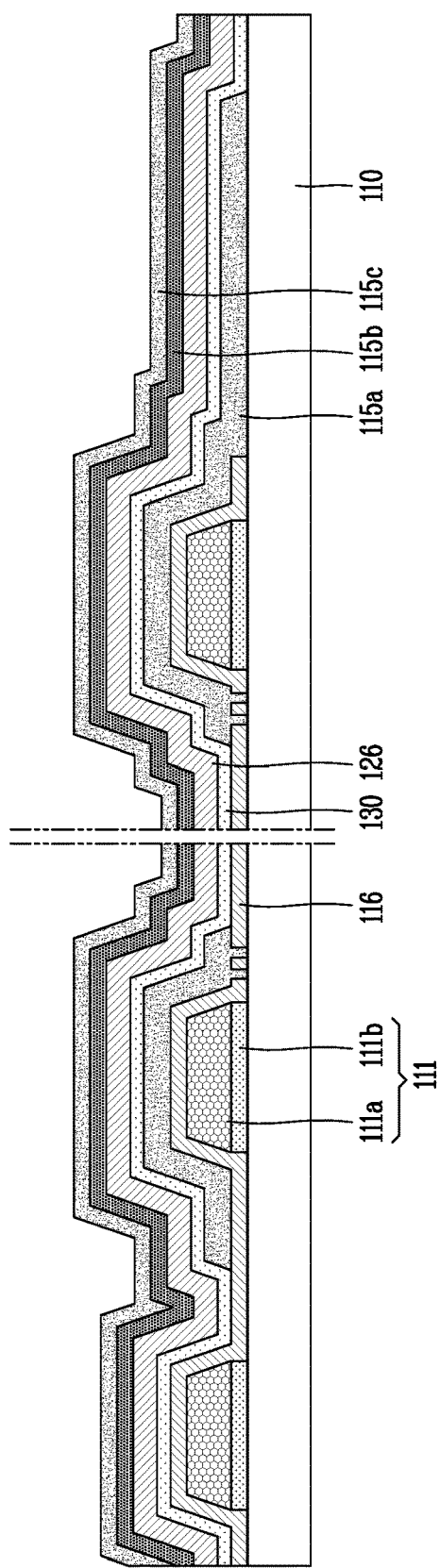

Subsequently, referring to FIGS. 7C and 9C, an organic emissive layer 130, a second electrode 126, a second passivation layer 115b, and a third passivation layer 115c are formed by sequentially depositing an organic emissive material, a metal, an organic insulating material, and an inorganic insulating material across the entire surface of the substrate 110.

In this case, the organic emissive layer 130 is a white organic emissive layer, and may be made up of blue, red, and green emitting layers or be made up of a blue emitting layer and a yellow-green emitting layer stacked in tandem. Moreover, the organic emissive layer 130 may include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

The second electrode 126 may be made of metal, such as Al, Mo, Cu, and Ag, or an alloy such as MoTi.

The first electrode 116, organic emissive layer 130, and second electrode 126 in the lighting area constitute an organic light-emitting diode.

Since the first passivation layer 115a is positioned over the auxiliary electrode 111 in the lighting area, the organic emissive layer 130 above the auxiliary electrode 111 does not come into direct contact with the first electrode 116 and therefore the organic light-emitting diode is not present on the auxiliary electrode 111. That is, the organic light-emitting diode in the lighting area is formed only in the light-emission area within the auxiliary electrode 111 that has the shape of a matrix, for example (see FIG. 8).

As such, in the lighting apparatus using an organic light-emitting diode according to the exemplary aspect of the present disclosure, the organic emissive layer 130, second electrode 126, and second and third passivation layers 115b and 115c are deposited on the entire surface, without using an open mask, which is a separate, complicated tool, and this may reduce costs and simplify the processes and equipment, making them adaptable to a variety of models without additional cost. Moreover, OLEDs may be patterned using simple equipment, without using an open mask and other tools, which is useful for roll-to-roll manufacturing.

Figure 7D:
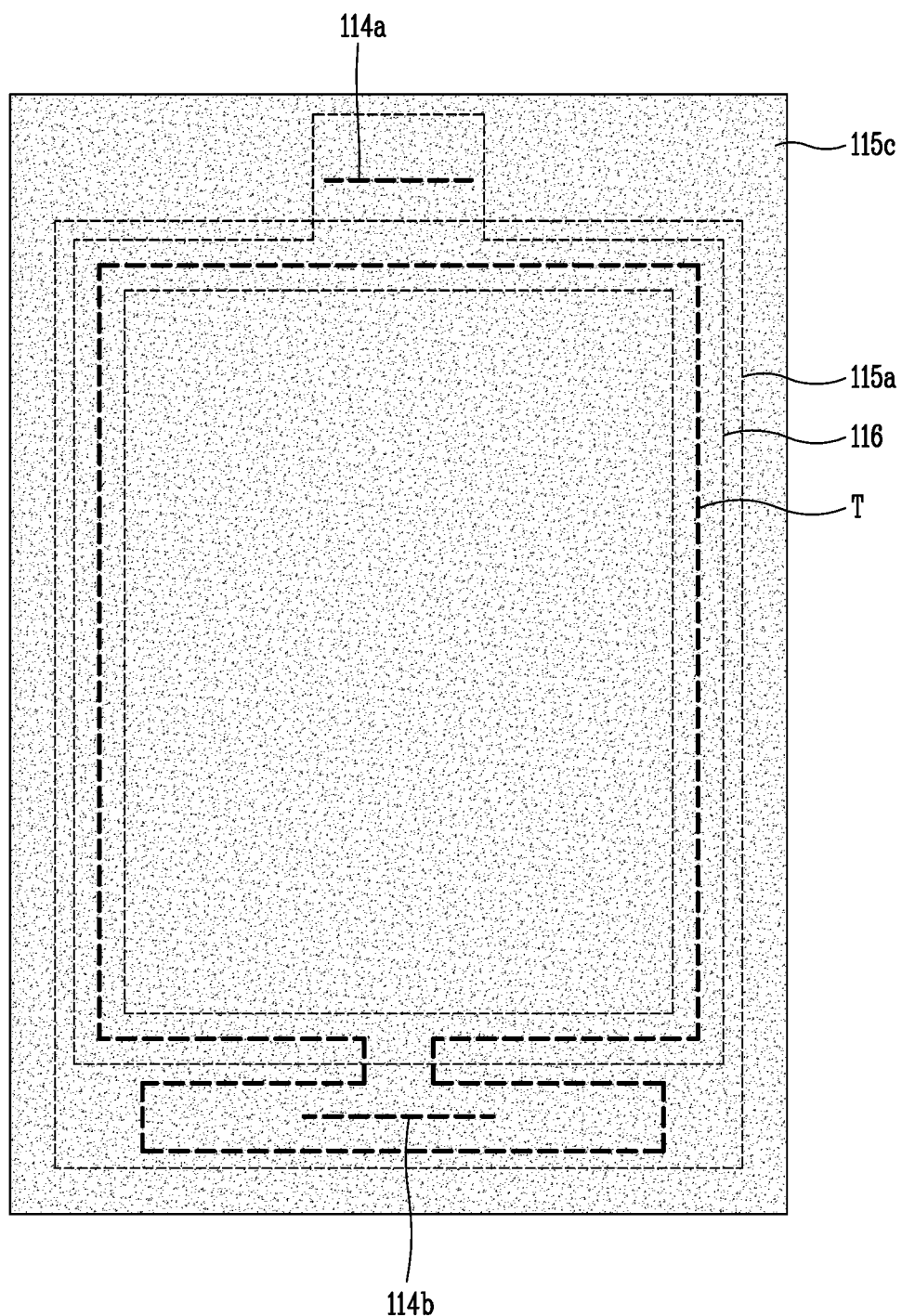
Figure 9D:
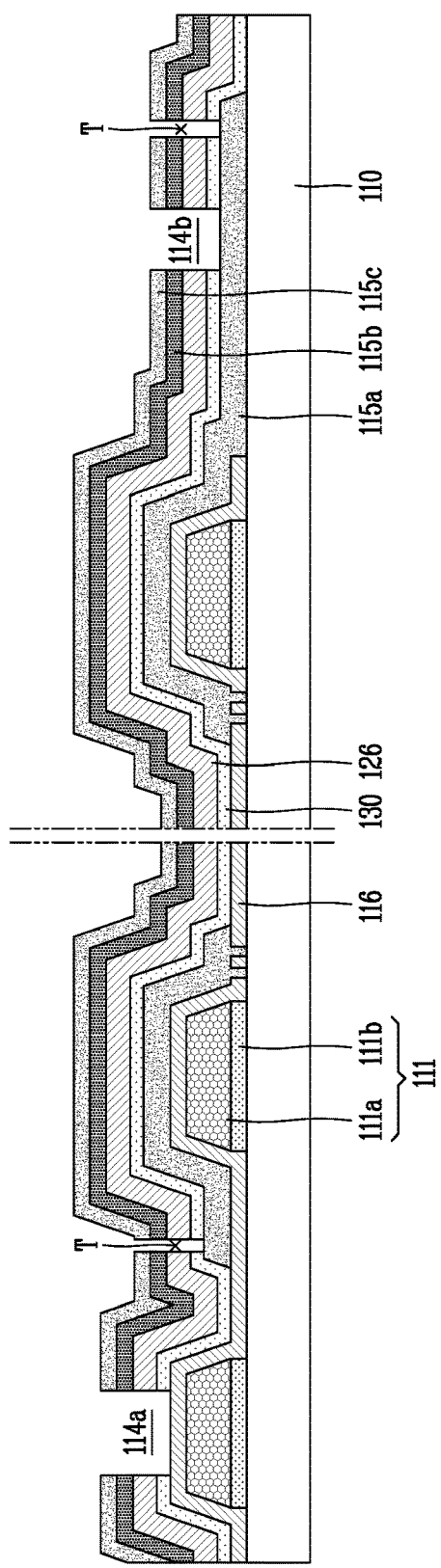

Subsequently, referring to FIGS. 7D and 9D, a trench T exposing the surface of the first passivation layer 115a is formed in the peripheral areas of the substrate 110 by partially removing the organic emissive layer 130, second electrode 126, and second and third passivation layers 115a and 115b which are deposited over the entire surface.

Additionally, using laser ablation, a first contact hole 114a exposing the first electrode 116 may be formed by removing the organic emissive layer 130, second electrode 126, and second and third passivation layers 115a and 115b from the first contact area of the substrate 110, and at the same time, a second contact hole 114b exposing the first passivation layer 115a may be formed by removing the organic emissive layer 130, second electrode 126, and second and third passivation layers 115a and 115b from the second contact area of the substrate 110.

As the above-described trench T is formed in the peripheral areas of the substrate 110, the organic emissive layer 130 in the lighting area and the organic emissive layer 130 in the peripheral areas may be separated from each other. In the present disclosure, since the organic emissive layer 130 in the lighting area and the organic emissive layer 130 in the peripheral areas are separated by the trench T, moisture penetrating the outer region of the organic emissive layer 130 may be prevented from spreading along the organic emissive layer 130 into the lighting area from which light is actually emitted. Moreover, in the present disclosure, the organic emissive layer 130 becomes separated by laser ablation without addition of any open mask or photolithography process, thereby avoiding an additional fabrication process and the resulting increase in cost.

Figure 7E:
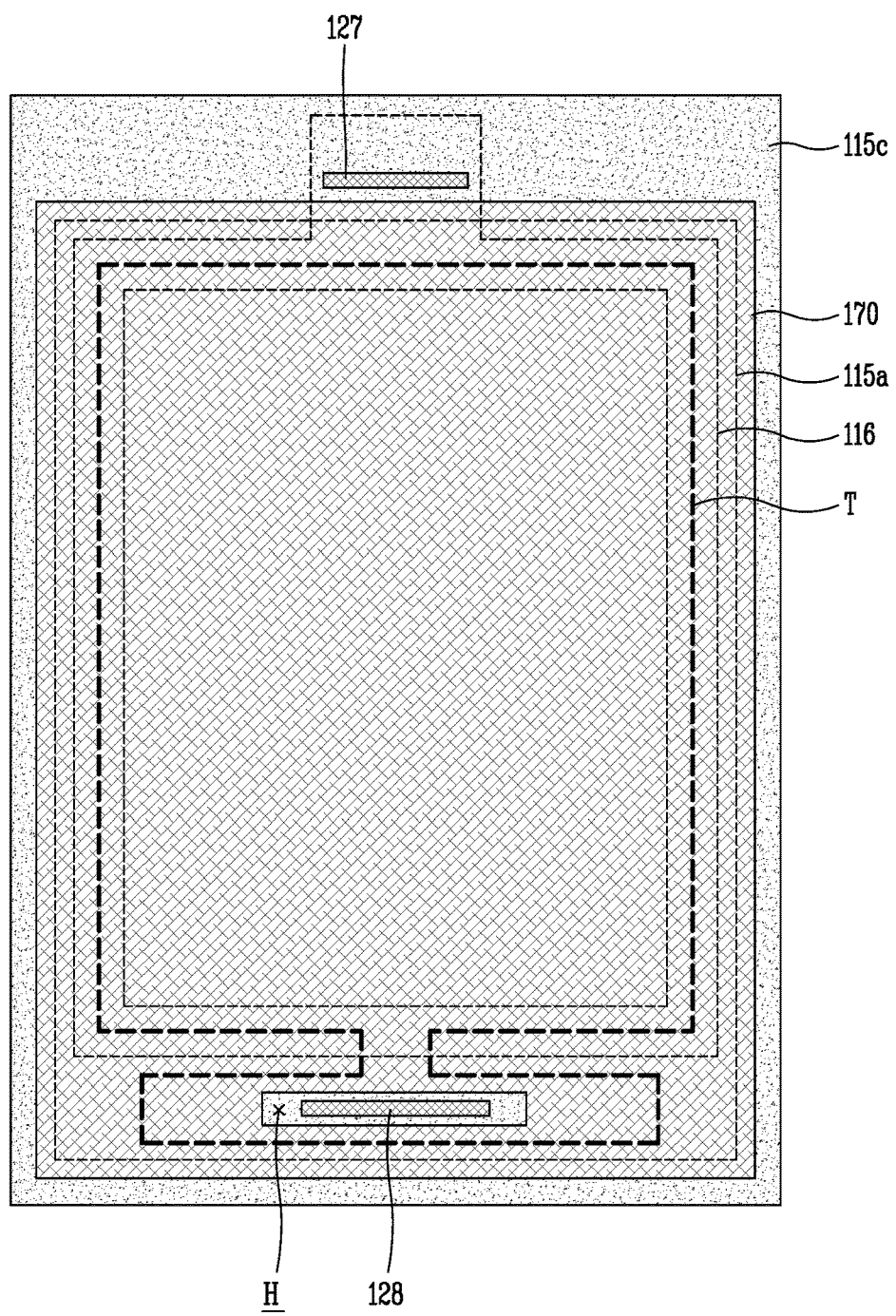
Figure 9E:
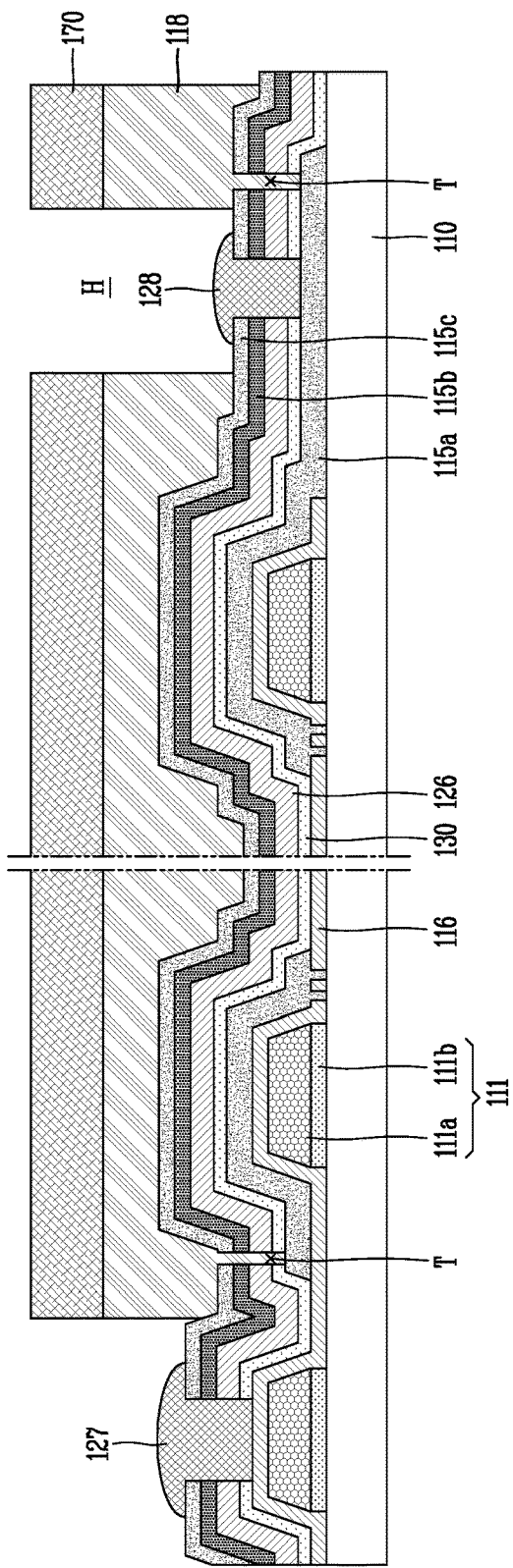

Subsequently, referring to FIGS. 7E and 9E, a first contact electrode 127, electrically connected to the first electrode 116 via the first contact hole 114a, and a second contact electrode 128, electrically connected to the second electrode 126 via the second contact hole 114b, are formed by Ag printing.

In this case, the first and second contact electrodes 127 and 128 may be electrically connected externally, and they, along with the trench T, may prevent moisture penetration through the sides, as well as applying a signal to the lighting area.

Afterwards, an adhesive 118 made of a light curing adhesive material or a heat curing adhesive material is applied over the substrate 110. Further, a metal film 170 is positioned over the adhesive 118, and then the adhesive 118 is cured to attach the metal film 117, thereby completing the lighting apparatus.

Although the above description contains specific examples, these should not be construed as limiting the scope of the disclosure, but as merely providing illustrations of some of the preferred aspects of this disclosure. Therefore, the scope of the disclosure is defined not by the detailed description, but by the claims and their equivalents.

What is claimed is:

1. A lighting apparatus using an organic light-emitting diode, comprising:
    a substrate having a lighting area, first and second peripheral areas, and first and second contact areas;
    a first electrode on the substrate;
    a first passivation layer on the first electrode;
    an organic emissive layer, a second electrode, and a second passivation layer on the entire surface of the substrate including the first passivation layer;
    a trench in the first and second peripheral areas and disconnecting the organic emissive layer in the lighting area at the first and second peripheral areas;
    an adhesive on the second passivation layer including an inside of the trench; and
    a metal film on the adhesive in the lighting area and the first and second peripheral areas.

2. The lighting apparatus of claim 1, wherein the first electrode is disposed at the lighting area, first and second peripheral areas, and the first contact area.

3. The lighting apparatus of claim 1, wherein the first passivation layer is disposed at the lighting area and the first and second peripheral areas where the first electrode and the second contact area are formed.

4. The lighting apparatus of claim 1, wherein a portion of the first passivation layer is exposed by the trench by removing portions of the organic emissive layer, the second electrode, and the second passivation layer at the first and second peripheral areas.

5. The lighting apparatus of claim 4, wherein the adhesive layer is disposed in the trench that is provided by removing the organic emissive layer, the second electrode, and second passivation layer.

6. The lighting apparatus of claim 4, wherein the trench has a rectangular shape along an outer perimeter of the lighting area, in the peripheral areas of the substrate.

7. The lighting apparatus of claim 1, further comprising first and second contact electrodes placed at the first and second contact areas of the substrate and electrically connected to the first and second electrodes, respectively.

8. The lighting apparatus of claim 1, wherein the second contact area of the substrate is positioned at the second peripheral area of the substrate, and exposes the second contact electrode to an outside of the apparatus by removing the metal film.

9. The lighting apparatus of claim 1, wherein the organic emissive layer, the second electrode, and the second passivation layer are exposed at an outermost side area of the substrate.

10. A method of fabricating a lighting apparatus using an organic light-emitting diode, the method comprising:
    forming a first electrode on a substrate having a lighting area, first and second peripheral areas, and first and second contact areas;
    forming a first passivation layer on the substrate where the first electrode is formed;
    forming an organic emissive layer, a second electrode, and a second passivation layer on the entire surface of the substrate including the first passivation layer;
    forming a trench by removing the organic emissive layer, the second electrode, and the second passivation layer from the first and second peripheral areas, the trench disconnecting the organic emissive layer in the lighting area from the organic emissive layer in the first and second peripheral areas; and
    attaching a metal film on the second passivation layer in the lighting area and the first and second peripheral areas, with an adhesive in between.

11. The method of claim 10, wherein the first electrode is formed in the lighting area, the first and second peripheral areas, and the first contact area of the substrate.

12. The method of claim 10, wherein the first passivation layer is formed in the lighting area and the first and the second peripheral areas of the substrate where the first electrode and the second contact area of the substrate are formed.

13. The method of claim 10, wherein the trench exposes a portion of the first passivation layer by removing portions of the organic emissive layer, the second electrode, and the second passivation layer from the first and second peripheral areas of the substrate through laser ablation.

14. The method of claim 13, wherein the adhesive layer is disposed in the trench that is formed by removing portions of the organic emissive layer, the second electrode, and the second passivation layer.

15. The method of claim 10, further comprising, when forming the trench, simultaneously forming first and second contact holes exposing the first electrode and the first passivation layer by removing the organic emissive layer, the second electrode, and the second passivation layer from the first and second contact areas of the substrate.

16. The method of claim 15, further comprising forming first and second contact electrodes in the first and second contact areas of the substrate, the first and second contact electrodes being electrically connected to the first and second electrodes via the first and second contact holes after the forming first and second contact holes.

17. An organic light-emitting diode for a lighting apparatus, comprising:
a substrate having a lighting area, a peripheral area, and first and second contact areas;
an auxiliary electrode on the substrate;
a first electrode on the auxiliary electrode;
a first passivation layer on the substrate including the first electrode;
an organic emissive layer, a second electrode, and a second passivation layer on the entire surface of the substrate including the first passivation layer; and
a trench disconnecting the organic emissive layer at the peripheral area.

18. The organic light-emitting diode of claim 17, further comprising a first contact electrode in the first contact area and electrically connected to the first electrode.

19. The organic light-emitting diode of claim 18, further comprising a second contact electrode in the second contact area and electrically connected to the first electrode.

20. The organic light-emitting diode of claim 17, wherein the organic emissive layer, the second electrode, and the second passivation layer are exposed at an outermost side area of the substrate.

* * * * *